United States Patent [19]

Schade, Jr.

[11] 4,008,441

[45] Feb. 15, 1977

[54] CURRENT AMPLIFIER

[75] Inventor: Otto Heinrich Schade, Jr., North Caldwell, N.J.

[73] Assignee: RCA Corporation, New York, N.Y.

[22] Filed: Aug. 16, 1974

[21] Appl. No.: 498,108

[52] U.S. Cl. .................................... 330/35; 323/4; 330/19; 330/22; 330/28

[51] Int. Cl.$^2$ .......................................... H03F 3/16

[58] Field of Search .................. 330/19, 22, 32, 35, 330/38 M, 28, 30 D; 323/4

[56] References Cited

UNITED STATES PATENTS

| | | | |
|---|---|---|---|
| 3,710,271 | 1/1973 | Putman | 330/35 |
| 3,813,607 | 5/1974 | Voorman | 330/19 X |
| 3,843,933 | 10/1974 | Ahmed | 330/28 |
| 3,870,965 | 3/1975 | Frederiksen | 330/19 X |

*Primary Examiner*—Rudolph V. Rolinec
*Assistant Examiner*—Lawrence J. Dahl
*Attorney, Agent, or Firm*—H. Christoffersen; S. Cohen; A. L. Limberg

[57] ABSTRACT

Current mirror amplifiers, each using a field-effect transistor as a source follower to provide collector-to-base feedback to a first bipolar transistor to condition its collector-to-emitter path to accept an input current. A second bipolar transistor has its base-emitter circuit parallelled with base-emitter circuit of the first bipolar transistor which conditions the collector-to-emitter path of the second bipolar transistor to conduct an output current proportionally related to that in the collector-to-emitter path of the first bipolar transistor. Since the source follower supplies the base currents of the bipolar transistors without requiring any gate current, the ratio of the input to output currents is constant regardless of the current gain of the bipolar transistors.

38 Claims, 9 Drawing Figures

CURRENT AMPLIFIER

Figure 1:
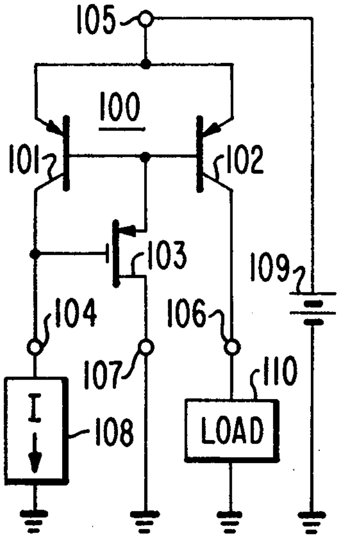

The present invention relates to current amplifiers of the type commonly referred to as "current mirror amplifiers."

Current mirror amplifiers are three-terminal amplifier circuits in which first and second transistors are connected at their emitter electrodes to the common terminal and at their respective collector electrodes to the input terminal and to the output terminal, respectively. The first transistor is provided with collector-to-base feedback which regulates the amplitude of its collector current to substantially equal the amplitude of a current supplied or withdrawn via the input terminal. The base-emitter potential of the first transistor is applied to the base-emitter junction of the second transistor to cause the collector current supplied or withdrawn via the output terminal to be proportionally related to the input current (i.e., first transistor collector current) in the ratio of the second transistor transconductance to the first transistor transconductance. In a monolithic integrated circuit, the transconductances of transistors with similar diffusion profiles are proportional to the areas of their base-emitter junctions, so the current gain of the integrated current mirror amplifier can be largely predetermined by the relative geometries of its component transistors.

The accuracy of this predetermination can be strongly influenced by transistor base current flows, however, when the current gains of the transistors in the current mirror amplifier are low (e.g. less than 10). In such instance, the admixture of transistor base currents with the collector current of the first or the second transistor, arising because of the feedback connection, can undesirably influence the current gain of the current mirror amplifier. This problem makes itself especially apparent in the case of current mirror amplifiers using lateral PNP integrated transistor structures.

One may solve this problem by providing for current amplification in the collector-to-base feedback connection, to reduce the amount of current taken from either the input or output current of the current mirror amplifier in order to support base current flows to the first and second transistors used in the current mirroring process. This approach to solving the problem is followed, for example, in U.S. Pat. No. 3,813,607, and in U.S. Pat. No. 3,887,879 issued 3 June 1975 to J. S. Radovsky, entitled CURRENT AMPLIFIER, and assigned to RCA Corporation, assignee of rights under the present application. As taught by Radovsky, the current amplifier used in the feedback connection must have a current gain characteristic which provides a satisfactory phase margin for the feedback loop it forms with the first transistor, thereby to avoid positive feedback conditions in the current mirror amplifier which may cause it to be self-oscillatory. Radovsky shows that stability against self-oscillation in such high current gain feedback loop is best achieved by use of a capacitor in the feedback loop, the capacitor being connected to provide a low pass filter function determining the primary zero of frequency response at a frequency well below other zeroes of response. It would be desirable, however, to solve the problem of base currents affecting current mirror amplifier gains in a manner less prone to self-oscillatory tendencies. This would permit dispensing with a capacitor for stabilizing the feedback loop in the current mirror amplifier in a wider range of designs, eliminating an element that tends to consume area on an integrated circuit.

It has been recognized in the art that complete current and potential symmetry, insofar as the biasing and operation of the first and second current mirror amplifier transistors are concerned, would be desirable. In addition to the previously mentioned work, attempts to aproach this ideal are described in U.S. Pat. application Ser. No. 318,645, filed Dec. 26, 1972, in the name of H. A Wittlinger, and entitled CURRENT AMPLIFIER; in my U.S. Pat. application Ser. No. 318,646, filed Dec. 26, 1972, and entitled IMPROVEMENT FOR CURRENT MIRROR APPLICATIONS; in U.S. Pat. application Ser. No. 348,723, filed Apr. 6, 1973, in the name of A. A. A. Ahmed, and entitled CURRENT AMPLIFIER; in my U.S. Pat. application Ser. No. 387,171, filed Aug. 9, 1973 and entitled CURRENT AMPLIFIER; in U.S. Pat. application Ser. No. 461,229, filed Apr. 15, 1974, in the name of A. A. A. Ahmed and entitled CURRENT AMPLIFIER; and in U.S. Pat. application Ser. No. 498,107 filed Aug. 16, 1974 in the name of M. B. Knight and entitled CIRCUIT FOR COMPENSATION OF LEAKAGE CURRENT. Each of these applications share a common assignee, RCA Corporation, with this application. RCA Corporations's Technical Note No. 949 of Dec. 31, 1973, entitled CURRENT-MIRROR AMPLIFIERS HAVING CURRENT GAINS LESS INFLUENCED BY THE BASE CURRENTS OF COMPONENT TRANSISTORS by J. S. Radovsky described a number of other approximations to perfect solution of this problem. Complete current and potential symmetry insofar as the biasing and operation of the first and second transistors has previously eluded workers in the field, however.

The present invention is embodied in a current mirror amplifier of the type generally described above, but having a field-effect transistor (FET) connected as a source follower in the collector-to-base feedback connection of its first transistor. Since the FET draws or supplies no current at its gate electrode, the collector current of the first transistor is neither depleted nor augmented to affect adversely the current gain of the current mirror amplifier as determined by the ratio of the transconductance of the second transistor to that of the first transistor. The FET does not operate to provide current gain at all—in contrast to prior art current mirror amplifiers employing bipolar transistors in the collector-to-base feedback connections of their respective first transistors. Rather, the source-follower FET operates only as a transconductance amplifier, which the present inventor has found to be sufficient to obtain current mirror amplifier operation.

In the drawing:

Each of FIGS. 1–9 is a schematic diagram of a current mirror amplifier embodying the present invention, FIG. 1 being the simplest embodiment of the present invention.

In the FIG. 1 configuration, current mirror amplifier 100 comprises bipolar PNP transistors 101 and 102 and p-channel metal-oxide-semiconductor field-effect transistor (PMOSFET) 103. The current mirror amplifier 100 has an input terminal 104, a common terminal 105, an output terminal 106, and another terminal 107. Input terminal 104 has a source 108 of input current (I) connected to withdraw current to itself. Common terminal 105 is connected to receive a positive, operating potential from supply 109, shown as a battery. Output terminal 106 is connected to a load 110 having a direct current conductive path therethrough. The other terminal 107 is connected to ground reference potential to bias the drain electrode of PMOSFET 103 for source-follower operation.

Transistor 101 has its base-emitter potential regulated by direct-coupled collector-to-base degenerative feedback applied by means of the source-follower action of PMOSFET 103. This feedback conditions transistor 101 to supply a collector current to terminal 104 exactly equal to the current I withdrawn by source 108. This is necessary to satisfy the imperative of Kirchoff Current Law, since no current flows through the gate electrode of PMOSFET 103.

The gate-to-source potential of source-follower 103 is adjusted by degenerative feedback to a value such that PMOSFET 103 is sufficiently conductive to supply both (a) the base current needed by transistor 101 to support a collector current flow of I, and (b) the base current needed by transistor 102 responsive to its base-emitter junction having the regulated base-emitter potential of transistor 101 applied to it. Since the transconductance of a FET is usually relatively low compared to that of a bipolar transistor, the variation in gate-to-source potential of FET 103 will be substantially larger than would be exhibited by a bipolar transistor in its stead. Thus, the collector-to-base potential of transistor 101 (and, consequently, its collector-to-emitter potential) changes with the current I withdrawn from its collector electrode.

The collector current $I_{C101}$ of transistor 101 is equal to its base-emitter potential $V_{BE101}$ multiplied by its transconductance $g_{m101}$ and the collector current $I_{C102}$ of transistor 102 is equal to its base-emitter potential $V_{BE102}$ multiplied by its transconductance $g_{m102}$. Transistor 102 has the regulated base-emitter potential $V_{BE101}$ of transistor 101 directly applied to its base-emitter junction. So:

$$V_{BE102} = V_{BE101} \quad (1)$$

$$\frac{I_{C102}}{g_{m102}} = \frac{I_{C101}}{g_{m101}} \quad (2)$$

$$\frac{I_{C102}}{I_{C101}} = \frac{g_{m102}}{g_{m101}} \quad (3)$$

That is, the current gain of the current mirror amplifier is the ratio of the transconductance of transistor 102 to the transconductance of transistor 101. In monolithic integrated circuitry, transistors having similar doping profiles have transconductances linearly proportional to the effective areas of their base-emitter junctions. The ratio of the collector current flowing from transistor 102 via terminal 106 to load 110 to the current I withdrawn by source 108 via terminal 104 as the collector current from transistor 101 can be therefore predicted in terms of the relative dimensions of transistors 101 and 102, substantially independently of their common-emitter forward current gains ($h_{fe}$'s).

This improved measure of predictability is because the response to the combined base currents of transistors 101 and 102 in the current mirror amplifier 100 input and output currents do not differ as is the case in prior art current mirror amplifier designs. Indeed, there is no response to these combined base currents of transistors 101 and 102 in the input or output current of the current mirror amplifier 100, since these combined base curents flow through the channel of source-follower PMOSFET 103 through terminal 107 to ground reference potential and not through either source 108 or load 110.

While transistor 103 is shown as a PMOSFET, a p-channel junction gate field-effect transistor (PJUGFET) of the enhancement type will work similarly. A PJUGFET of the depletion type can also be used, but then a potential translation element will also have to be included in the collector-to-base feedback connection of transistor 101. This translation element could, for example, be a diode connected between the source electrode of the source follower and the interconnected base electrodes of the mirror transistors and operated in avalanche mode.

Figure 2:
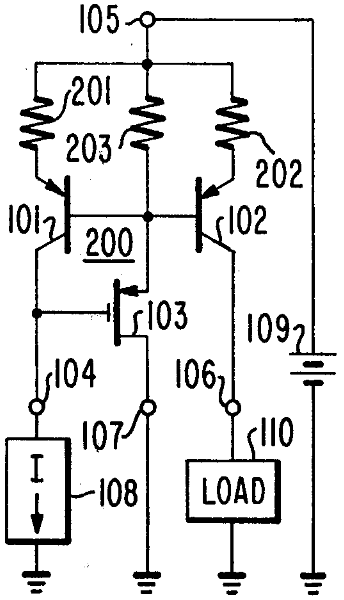

FIG. 2 shows a current mirror amplifier 200. It differs from current mirror amplifier 100 in that transistors 101 and 102 are provided with emitter degeneration resistors 201 and 202, respectively. The resistances $R_{201}$ and $R_{202}$ of resistors 201 and 202, respectively, will not affect the current gain $I_{C102}/I_{C101}$ if they are chosen to fit the following relationships:

$$\frac{R_{201}}{R_{202}} = \frac{I_{C102}}{I_{C101}} = \frac{g_{m102}}{g_{m101}} \quad (4)$$

The resistances are normally chosen to be within a range of values $0<R_{201}<10/g_{m101}$, $0<R_{202}<10/g_{m102}$. The use of these emitter degeneration resistors 201 and 202 improves the accuracy of the determination of current gain in state-of-the-art monolithic integrated circuit processing.

Resistor 203 is a passive pull-up resistor which improves the slew rate of the source follower PMOSFET 103 for positive-going output potential changes. The resistance of resistor 203 can be made relatively small, compared to a passive pull-up resistor where source follower PMOSFET 103 is replaced by an emitter-follower bipolar transistor, without affecting the current gain of the current mirror amplifier 200. This is an important feature when one requires a current mirror amplifier having both very accurately predetermined current gain and wideband frequency response at that gain.

Figure 3:
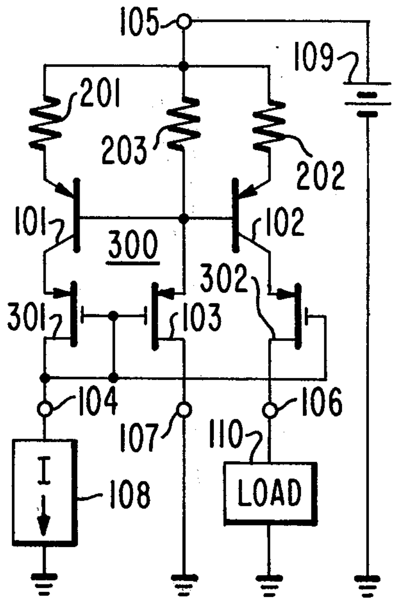

FIG. 3 shows a current mirror amplifier 300 in which PMOSFET's 301 and 302 have been introduced in cascode connection with transistors 101 and 102, respectively. The cascode connection of transistors 102 and 302 raises the output impedance of current mirror amplifier relative to that of a current mirror amplifier 200 of otherwise similar construction. The gate electrodes of PMOSFET's 301 and 302 as well as that of PMOSFET 103 are connected to the input terminal 104. This can be done without affecting the current gain of current mirror amplifier 300, as determined by the relative transconductances of transistors 101 and 102 and the relative resistances of resistors 201 and 202, there being no currents to or from the gate electrodes of transistors 301 and 302 because of them being FET's.

The relative transconductances of PMOSFET's 301 and 302 are chosen so their respective source-follower actions regulate the collector potentials of transistors 101 and 102, respectively, to the same value. This imposes similar collector-to-emitter potentials on transistors 101 and 102 and causes an improvement in the constancy of the ratio of their relative transconductances over a range of operating currents. That is, current gain of the current mirror amplifier 300 can be expected to vary even less than that of current mirror amplifier 200 with changing input current level, I. The transconductance characteristics of a field-effect transistor are determined by its physical dimensions, according to known principles.

The transconductances of PMOSFET's 301 and 302 can be proportioned to that of PMOSFET 103 so that the collector potentials of transistors 101 and 102 are equal to their shared base potential. This will eliminate the flow of collector leakage current ($I_{CO}$) in each of transistors 101 and 102 and can be useful in obtaining a more accurately predetermined current gain from the current mirror amplifier 300 than would otherwise be possible.

Figure 4:
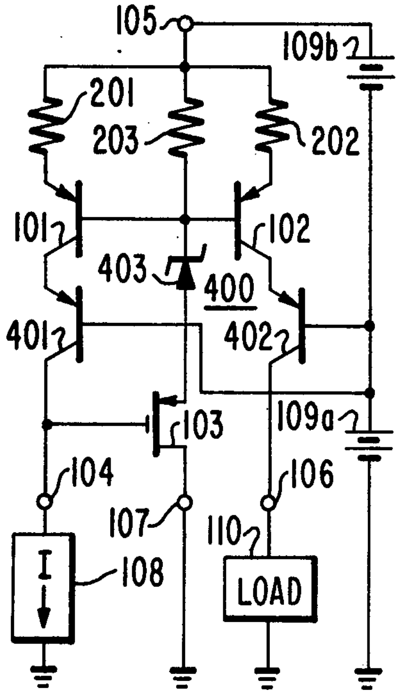

Even higher output impedance can be obtained with a current mirror amplifier 400, as shown in FIG. 4, in which the PMOSFET's 301 and 302 are replaced with high-transconductance bipolar transistors 401 and 402, respectively having matched $h_{fe}$'s. Transistors 401 and 402, being bipolar transistors, draw base currents, however. So their base electrodes cannot be connected to the input terminal without affecting the current gain of the current mirror amplifier by introducing into it a generally undesirable dependency upon the $h_{fe}$'s of transistors 401 and 402. This problem is avoided in the FIG. 4 circuit by constructing potential supply 109 with serially-connected potential supplies 109*a* and 109*b* to obtain an intermediate biasing potential applied to the base electrodes of transistors 401 and 402. The base currents of transistors 401 and 402 do not flow through source 108 or through load 110 and do not affect the current gain of current mirror amplifier 400, assuming the $h_{fe}$'s of transistors 401 and 402 to be similar.

In consequence of the base electrodes of transistors 401 and 402 being at the same potential, their respective emitter follower actions hold the collector potentials of transistors 101 and 102, respectively, at the same value. As noted before, this increases the accuracy of the predetermination of current mirror amplifier gain by elements 101, 102, 201, 202.

Avalanche diode 403 acts as a potential translating element, its offset potential being added to the gate-to-source potential of PMOSFET 103 to cause a greater potential between input terminal 104 and the interconnection of the base electrodes of transistors 101 and 102. This affords a greater range of potential to which the base electrodes of the common-base amplifier transistors 401 and 402 may be biased. This freedom is important where potential supply 109*b*, shown as a battery, is in fact a poorly regulated biasing potential source.

Figure 5:
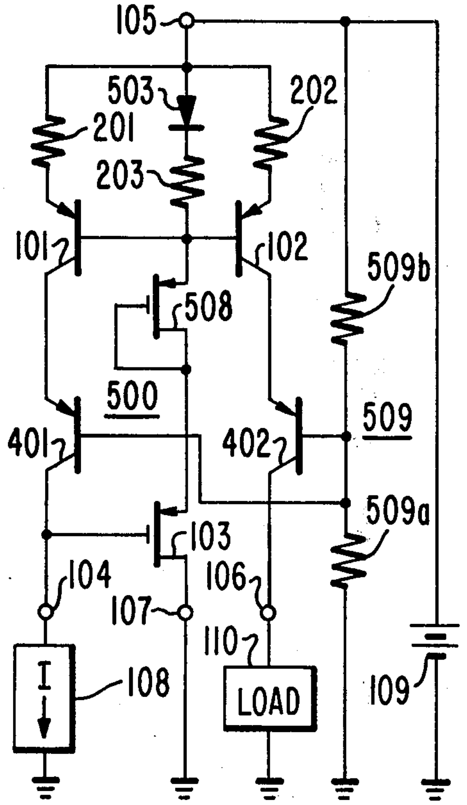

This type of situation may arise in circumstances where, as shown in FIG. 5, the intermediate potential for biasing the base electrodes of transistors 401 and 402 is derived from potential supply 109 using a resistive potential divider 509. The resistances of resistors 509*a* and 509*b* in the potential divider are customarily chosen to be as high as possible to reduce loading upon potential supply 109. Variation of the $h_{fe}$'s of transistors 401 and 402 and/or variation in the magnitude of input current, I, caused to flow by source 108 will cause variation in the base currents of transistors 401 and 402. These base current variations will change the loading on the resistive potential divider 509 and, if its source resistance is high, will perturb the intermediate potential it supplies to the base electrodes of transistors 401 and 402.

In FIG. 5, current amplifier 500 uses an enhancement type PMOSFET 503, self-biased with drain-to-gate feedback provided by direct connection, as a potential translating element instead of avalanche diode 403. PMOSFET 503 maintains its threshold gate-to-source potential between its drain and source electrodes. Avalanche diode 403 could also be replaced by a properly poled self-biased n-channel enhancement-type FET.

Where the intermediate potential applied to the base electrodes of transistors 401 and 402 is well-defined with respect to the potential at terminal 105, and the source-to-gate offset potential of an enhancement type source follower transistor 103 is sufficiently large, the source electrode of transistor 103 may be directly connected to the base electrodes of transistors 101 and 102.

In FIG. 5, the simple-pull-up resistor 203 has a diode 503 serially connected therewith. Diode 503 is poled for forward conduction and its offset potential responsive to forward conduction reduces the potential available as a drop across resistor 203. This can permit a lower resistance for resistor 203, while keeping current flow therethrough at a reduced value. This can permit more compact integrated-circuit construction. Also, in circuits where the current mirror amplifier 500 has input current withdrawn from it only intermittently, the standby current of the source follower can be reduced to reduce the power dissipation through heat from the circuit. Conventionally, in monolithic integrated circuit construction, diode 503 will comprise an NPN transistor, its emitter electrode serving as cathode and its interconnected base and collector electrodes serving as anode. A diode-connected PNP transistor might also be used.

Figure 6:
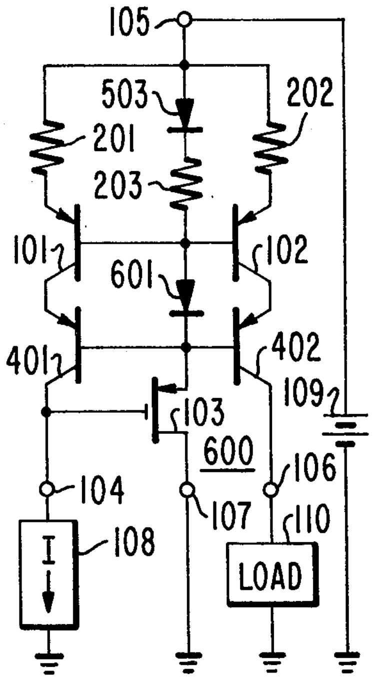

FIG. 6 shows a current mirror amplifier 600 in which the biasing of the base electrodes of transistors 401 and 402 is obtained from the source circuit of source-follower transistor 103. As previously noted, current demands upon the source circuit of PMOSFET 103 do not cause current flow at its gate electrode, and these current demands do not affect the current gain of the current mirror amplifier. A potential-offsetting element 601 is used to offset the potential at the source electrode of transistor 103 from the shared base potential of transistors 101 and 102 by an amount sufficient that the offset potentials across the forward-conducting emitter-base junctions of transistors 401 and 402 will not cause saturated operation of transistors 101 and 102 because of insufficiently negative collector potentials.

A forward-biased diode (as shown in FIG. 6) is the favored potential-offsetting element 601, since it places the collector electrodes of transistors 101 and 102 at the same potential as their base electrodes to eliminate collector leakage currents ($I_{CO}$'s) that undesirably may affect current mirror amplifier current gains. However, an avalanche diode or self-biased MOSFET may be used instead of diode 601.

The gate-to-source offset potential of FET 103 affords proper collector biasing for transistor 401 if FET 103 is of the enhancement type; use of a depletion-type FET 103 would necessitate an additional potential offsetting element between the source electrode of FET 103 and the joined base electrodes of transistors 401 and 402.

Figure 7:
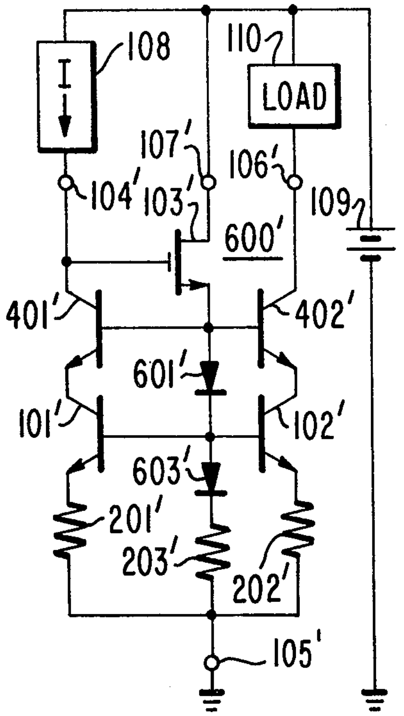

FIG. 7 shows a current mirror amplifier 600' similar to a current mirror amplifier 600, but using transistors of opposite conductivity type. Any of the current mirror amplifiers 100, 200, 300, 400, 500, 600, 800, 900 or variants thereof can be constructed substituting NPN bipolar transistors for PNP bipolar transistors and substituting n-channel FET's for p-channel FET's. (NPN bipolar transistors and n-channel FET's may be considered to be transistors of one conductivity type, and PNP transistors and p-channel FET's may be considered to be transistors of another conductivity type.) Current mirror amplifiers similar to 300 and 600 but constructed with opposite conductivity type transistors are of particular interest, however, since in them transistors 101′ and 102′ analagous to transistors 101 and 102 operate with substantially zero-values base-to-collector potentials. This permits transistors 101′ and 102′ to be super-beta types. Super-beta transistors are transistors formed with thinner base regions than conventional transistors. Super-beta transistors, although their collector-to-emitter breakdown potentials are very low, have exceptionally high $h_{fe}$'s (or betas) ranging in the few hundreds. The large $h_{fe}$'s of super-beta transistors 101′ and 102′ will minimize inaccuracies in the predetermined current gain of the current mirror amplifier which are caused by mismatch between the $h_{fe}$'s of transistors 101′ and 102′. This comes about because the base-current levels of transistors 101′ and 102′ are negligible compared to the currents flowing in their collector-emitter paths, if their $h_{fe}$'s are sufficiently large.

Figure 8:
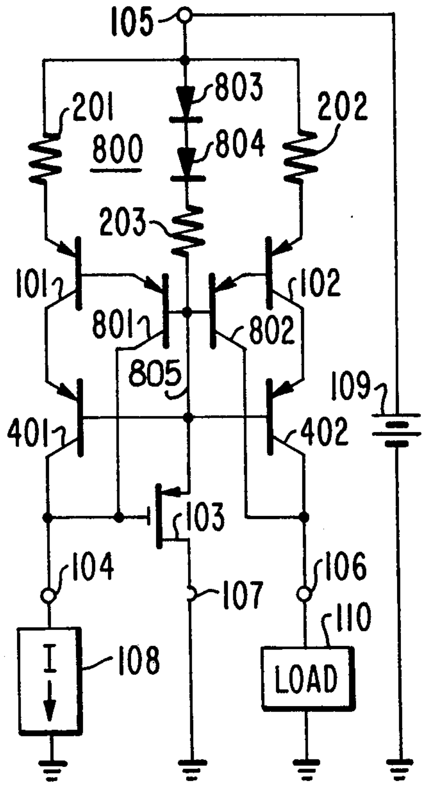

FIG. 8 shows a current mirror amplifier 800 differing from current mirror amplifier 600 primarily in that the potential-offsetting element 601 of FIG. 6 is not used to offset the source potential of FET 103 from the base potentials of transistors 101 and 102. Rather, the emitter-follower actions of transistors 801 and 802 provide separate, respective offset potentials between the source potential of FET 103 and the base potentials of transistors 101 and 102, respectively. The collector currents of transistors 801 and 802 are substantially equal to the base currents of transistors 101 and 102, respectively, because of the common-base amplifier properties of transistors 801 and 802. The collector currents of transistors 801 and 802 are added into the respective currents flowing out of the current amplifier 800 through terminal 104 and through terminal 106, respectively. This reduces any inaccuracies in the current gain of current mirror amplifier 800 being determined by the relative transconductances of transistors 102 and 101 if they, are not equal, as they should be. (Alternatively, a forward-biased diode may be inserted in connection 805 to permit the collector electrodes of transistors 801 and 802 to be connected respectively to the collector electrode of transistor 401 and to the collector electrode of transistor 402.)

The passive pull-down resistor 203 is serially-connected with diodes 803 and 804. The potential offset across the combination of diodes 803 and 804 reduces the potential available across resistor 203, permitting reduction in the current flow through resistor 203 for a given resistance value of resistor 203.

The FIG. 8 circuit can be constructed in a variant form as follows. Resistors 201, 202 and 203 are replaced by direct connections. Diodes 803 and 804 are provided by PNP's like transistor 101, with the emitter electrode of each serving as its anode and its inter-connected base and collector electrodes serving as its cathode. The current flowing through the serially-connected diodes 803 and 804 in this variation will tend to be comparatively small as compared to the emitter current of transistor 101. This is because only the base current of transistor 101 flows to forward-bias the emitter-base junction of transistor 801. The relatively small current flow through the emitter-base junction of transistor 801 causes the potentials developed across the base-emitter junction of transistor 801 to be relatively small compared to the potential developed across emitter-base junction of transistor 101. The sum of the emitter-base junction potentials of transistors 101 and 801 is of small enough value, therefore, that current flow in serially-connected diodes 803 and 804 is held at a relatively low value.

Figure 9:
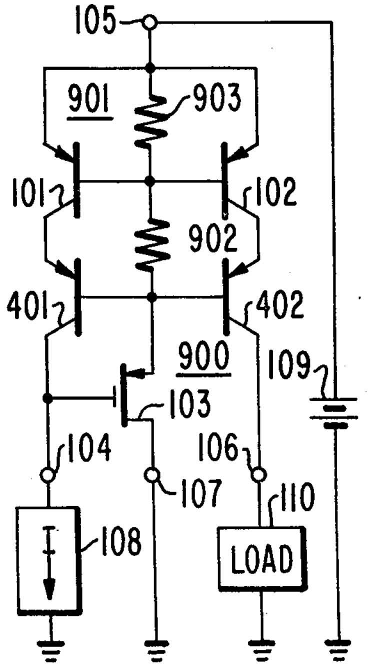

FIG. 9 shows a current mirror amplifier 900 in which the direct-coupled collector-to-base feedback of transistor 101 includes a source-follower transistor 103 and a resistive potential divider 901 comprising resistors 902 and 903. Transistors 101 and 102 are shown having their emitter electrodes directly connected to terminal 105 to receive positive operating potential applied from supply 109 and do not have emitter degeneration resistors. The direct-coupled collector-to-base feedback of transistor 101 regulates its base-emitter potential to flow to support a collector current flow from transistor 101 which, coupled through the common-base amplifier action of transistor 401 provides the input current demanded by source 108. That is, the output potential from the resistive potential divider 901 will be regulated by the collector-to-base feedback of transistor 101 to be a value logarithmically related to the collector current of transistor 101. This base-to-emitter potential will be reasonably constant over a wide range of collector current flows and will range from about 550 to 700 millivolts if transistor 101 is made from doped silicon.

The input potential of the potential divider 901 as appears between the source electrode of transistor 103 and terminal 105 is related to its output potential applied between the base and the emitter electrodes of transistor 101 in the following well-known way, assuming the combined resistance of resistors 902 and 903 is chosen small enough that the base current demands of transistors 101 and 102 does not present appreciable loading to the resistive potential divider 901.

$$\frac{E_{OUT}}{E_{IN}} = \frac{R_{903}}{R_{902} + R_{903}} \quad (5)$$

The resistance $R_{902}$ of resistor 902 is chosen to be at least half as large as the resistance $R_{903}$ of resistor 903, so that the offset potentials across the forward-biased base-emitter junctions of transistors 401 and 402 will not cause saturation of transistors 101 and 102.

Variations of the FIG. 9 circuit in which emitter degeneration resistors 201 and 202 are provided for transistors 101 and 102 are useful, also.

The current mirror amplifiers shown in FIGS. 1–9 are representative embodiments of my invention and other circuits using my teachings will readily come to the mind of a skilled electronics designer.

What is claimed is:

1. A current mirror amplifier comprising:

an input terminal, an output terminal and a common terminal;

first and second transistors, being bipolar junction transistors having respective emitter electrodes and respective base electrodes and respective collector electrodes;

first current conductive means connecting said common terminal to said first transistor emitter electrode;

second current conductive means connecting said common terminal to said second transistor emitter electrode;

third current conductive means connecting said first transistor collector electrode to said input terminal;

fourth current conductive means connecting said second transistor collector electrode to said output terminal;

a third transistor, being a field-effect transistor having a gate electrode connected to said input terminal, and having a source electrode and a drain electrode;

means for applying a potential between said common terminal and the drain electrode of said third transistor to condition said third transistor for source-follower operation;

first direct coupling means for direct coupling said third transistor source electrode to said first transistor base electrode; and second direct coupling means for direct coupling said third transistor source electrode to said second transistor base electrode, said first and said second direct coupling means each having substantially similar potential translating characteristics to each other.

2. A current mirror amplifier as set forth in claim 1 wherein each of said first, said second, said third and said fourth current conductive means are direct connections.

3. A current mirror amplifier as set forth in claim 2 wherein each of said first and said second direct coupling means are direct connections.

4. A current mirror amplifier as set forth in claim 1 wherein said first and said second current conductive means are first and second resistors, respectively, said first and said second resistors having resistances in a ratio inversely related to the ratio of the transconductances of said first and said second transistors, respectively, for similar base-emitter potential.

5. A current mirror amplifier as set forth in claim 4 wherein said third and said fourth current conductive means are direct connections.

6. A current mirror amplifier as set forth in claim 5 wherein said first and said second direct coupling means are direct connections.

7. A current mirror amplifier as set forth in claim 4 having:

a fourth transistor, which is a field-effect transistor, which has a source electrode connected to said second transistor collector electrode, which has a drain electrode connected to said output terminal, which has a channel between its said source and said drain electrodes corresponding to said fourth current conductive means, and which has a gate electrode connected to said input terminal.

8. A current mirror amplifier as set forth in claim 7 having:

a fifth transistor, which is a field-effect transistor, which has a source connected to said first transistor collector electrode, which has a drain electrode connected to said second transistor collector electrode, which has a channel between its said source and said drain electrodes corresponding to said third current conductive means, and which has a gate electrode connected to said input terminal.

9. A current mirror amplifier as set forth in claim 4 having:

a fourth transistor, which is a field-effect transistor, which has a source electrode connected to said second transistor collector electrode, which has a drain electrode connected to said output terminal, which has a channel between its said source and said drain electrodes corresponding to said fourth current conductive means, and which has a gate electrode; and means for applying a potential between said common terminal and said fourth transistor gate electrode, for said potential being of a value for conditioning said fourth transistor to operate as a common-gate amplifier.

10. A current mirror amplifier as set forth in claim 4 having:

fourth and fifth transistors, which are field-effect transistors, which have respective gate electrodes, which have respective source electrodes respectively connected to said first transistor collector electrode and to said second transistor collector electrode, which have respective drain electrodes respectively connected to said output terminal and to said input terminal, which have respective channels between their respective source and drain electrodes corresponding respectively to said fourth current conductive means and to said third current conductive means; and means for applying a potential between said common terminal and an interconnection between the gate electrodes of said fourth and said fifth transistors, said potential being of a value to condition said fourth transistor for common-gate amplifier operation.

11. A current mirror amplifier as set forth in claim 4 having:

a fourth transistor, which is of a bipolar junction type, which has an emitter electrode connected to said second transistor collector electrode, which has a collector electrode connected to said output terminal, which has an emitter-to-collector path corresponding to said fourth current conductive means, and which has a base electrode; and means for applying a potential between said common terminal and said fourth transistor base electrode, which potential is of a value to condition said fourth transistor for common-base amplifier operation.

12. A current mirror amplifier as set forth in claim 11 having:

a fifth transistor, which is of bipolar junction type, which has an emitter electrode connected to said first transistor collector electrode, which has a collector electrode connected to said input terminal, and which has a base electrode; and means for applying a potential between said common terminal and said fifth transistor base electrode, which potential is the same value as that of said potential applied between said common terminal and said fourth transistor base electrode.

13. A current mirror amplifier as set forth in claim 12 having:

means for providing an offset potential between its first and second ends, its first end being connected to said third transistor source electrode and its second end being more remote in potential from said third transistor gate electrode than is said third transistor source electrode;

a direct connection between said first transistor base electrode and said second end of said means for providing an offset potential, which direct connection and said means for providing an offset potential are comprised within said first direct coupling means; and a direct connection between said second transistor base electrode and said second end of said means for providing an offset potential, which direct connection and said means for providing an offset potential are comprised within said second direct coupling means.

14. A current mirror amplifier as set forth in claim 4 having:

a fourth transistor, which is of a bipolar junction type, which has an emitter electrode connected to said second transistor collector electrode, which has a collector electrode connected to said output terminal, which has an emitter-to-collector path corresponding to said fourth current condutive means, and which has a base electrode connected to said third transistor source electrode.

15. A current mirror amplifier as set forth in claim 14 having:

a fifth transistor, which is of a bipolar junction type, which has an emitter electrode connected to said first transistor collector electrode, which has a collector electrode connected to said input terminal, and which has a base electrode connected to said third transistor source electrode.

16. A current mirror amplifier as set forth in claim 15 having:

means for providing an offset potential between its first and second ends, its first end being connected to said third transistor source electrode and its second end being more remote in potential from said third transistor gate electrode than is said third transistor source electrode;

a direct connection between said first transistor base electrode and said second end of said means for providing an offset potential, which direct connection and said means for providing an offset potential are comprised within said first direct coupling means; and a direct connection between said second transistor base electrode and said second end of said means for providing an offset potential, which direct connection and said means for providing an offset potential are comprised within said second direct coupling means.

17. A current mirror amplifier as set forth in claim 16 wherein said means for providing an offset potential includes a diode poled to be forward-biased by said third transistor source current for maintaining the collector potentials of said first and said second transistors substantially equal to their respective base potentials.

18. A current mirror amplifier as set forth in claim 17 wherein said first and said second transistors are super-beta transistors.

19. A current mirror amplifier as set forth in claim 15 having:

a sixth transistor, which has a base electrode connected to said third transistor source electrode, which has an emitter electrode connected to said first transistor base electrode, which has a base-emitter junction between its said base and said emitter electrodes corresponding to said first direct coupling means, and which has a collector electrode coupled to said input terminal; and a seventh transistor, which has a base electrode connected to said third transistor source electrode, which has an emitter electrode connected to said second transistor base electrode, which has a base-emitter junction between its said base and said emitter electrodes corresponding to said second direct coupling means, and which has a collector electrode coupled to said ouput terminal.

20. A current mirror amplifier as set forth in claim 1 having:

a potential divider for dividing the potential between said common terminal and said third transistor source electrode and applying it between said common terminal and a point of connection;

a direct connection between said first transistor base electrode and said point of interconnection, which direct connection and said potential divider are comprised within said first direct coupling means; and a direct connection between said second transistor base electrode and said point of interconnection, which direct connection and said potential divider are comprised within said second direct coupling means.

21. A current mirror amplifier as set forth in claim 20 wherein said third and said fourth current conductive means are direct connections.

22. A current mirror amplifier as set forth in claim 21 wherein said first and said second direct coupling means are direct connections.

23. A current mirror amplifier as set forth in claim 1 having:

a fourth transistor, which is a field-effect transistor, which has a source electrode connected to said second transistor collector electrode, which has a drain electrode connected to said output terminal, which has a channel between its said source and said drain electrodes corresponding to said fourth current conductive means, and which has a gate electrode connected to said input terminal.

24. A current mirror amplifier as set forth in claim 23 having:

a fifth transistor, which is a field-effect transistor, which has a source electrode connected to said first transistor collector, which has a drain electrode connected to said second transistor collector electrode, which has a channel between its said source and said drain electrodes corresponding to said third current conductive means, and which has a gate electrode connected to said input terminal.

25. A current mirror amplifier as set forth in claim 1 having:

a fourth transistor, which is a field effect transistor, which has a source electrode connected to said second transistor collector electrode, which has a drain electrode connected to said output terminal, which has a channel between its said source and said drain electrodes corresponding to said fourth current conductive means, and which has a gate electrode; and means for applying a potential between said common terminal and said fourth transistor gate electrode, for said potential being of a value for conditioning said fourth transistor to operate as a common-gate amplifier.

26. A current mirror amplifier as set forth in claim 1 having:

fourth and fifth transistors, which are field-effect transistors, which have respective gate electrodes, which have respective source electrodes respectively connected to said first transistor collector electrode and to said second transistor collector electrode, which have respective drain electrodes respectively connected to said output terminal and to said input terminal, which have respective channels between their respective source and drain electrodes corresponding respectively to said fourth current conductive means and to said third current conductive means; and means for applying a potential between said common terminal and an interconnection between the gate electrodes of said fourth and said fifth transistors, said potential being of a value to condition said fourth transistor for common-gate amplifier operation.

27. A current mirror amplifier as set forth in claim 1 having:

a fourth transistor, which is of bipolar junction type, which has an emitter electrode connected to said second transistor collector electrode, which has a collector electrode connected to said output terminal, which has an emitter-to-collector path corresponding to said fourth current conductive means, and which has a base electrode; and means for applying a potential between said common terminal and said fourth transistor base electrode, which potential is of a value to condition said fourth transistor for common-base amplifier operation.

28. A current mirror amplifier as set forth in claim 26 having:

a fifth transistor, which is of bipolar junction type, which has an emitter electrode connected to said first transistor collector electrode, which has a collector electrode connected to said input terminal, and which has a base electrode; and means for applying a potential between said common terminal and said fifth transistor base electrode, which potential is the same value as that of said potential applied between said common terminal and said fourth transistor base electrode.

29. A current mirror amplifier as set forth in claim 28 having:

means for providing an offset potential between first and second ends thereof, its first end being connected to said third transistor source electrode and its second end being more remote in potential from said third transistor gate electrode than said third transistor source electrode;

a direct connection between said first transistor base electrode and said second end of said means for providing an offset potential, which direct connection and said means for providing an offset potential are comprised within said first direct coupling means; and a direct connection between said second transistor base electrode and said second end of said means for providing an offset potential, which direct connection and said means for providing an offset potential are comprised within said second direct coupling means.

30. A current mirror amplifier as set forth in claim 1 having:

a fourth transistor, which is of a bipolar junction type, which has an emitter electrode connected to said second transistor collector electrode, which has a collector electrode connected to said output terminal, which has an emitter-to-collector path corresponding to said fourth current conductive means, and which has a base electrode connected to said third transistor source electrode.

31. A current mirror amplifier as set forth in claim 30 having:

a fifth transistor, which is of a bipolar junction type, which has an emitter electrode connected to said first transistor collector electrode, which has a collector electrode connected to said input terminal, and which has a base electrode connected to said third transistor source electrode.

32. A current mirror amplifier as set forth in claim 31 having:

means for providing an offset potential between first and second ends thereof, its first end being connected to said third transistor source electrode and its second end being more remote in potential from said third transistor gate electrode than said third transistor source electrode;

a direct connection between said first transistor base electrode and said second end of said means for providing an offset potential, which direct connection and said means for providing an offset potential are comprised within said first direct coupling means; and a direct connection between said second transistor base electrode and said second end of said means for providing an offset potential, which direct connection and said means for providing an offset potential are comprised within said second direct coupling means.

33. A current mirror amplifier as set forth in claim 32 wherein said means for providing an offset potential includes a diode poled to be forward biased by said third transistor source current for maintaining the collector potentials of said first and said second transistors substantially equal to their respective base potentials.

34. A current mirror amplifier as set forth in claim 33 wherein said first and said second transistors are superbeta transistors.

35. A current mirror amplifier as set forth in claim 31 having:

a sixth transistor, which has a base electrode connected to said third transistor source electrode, which has an emitter electrode connected to said first transistor base electrode, which has a base-emitter junction between its said base and said emitter electrodes corresponding to said first direct coupling means, and which has a collector electrode coupled to said input terminal; and a seventh transistor, which has a base electrode connected to said third transistor source electrode, which has an emitter electrode connected to said second transistor base electrode, which has a base-emitter junction between its said base and said emitter electrodes corresponding to said second direct coupling means, and which has a collector electrode coupled to said output terminal.

36. A current mirror amplifier comprising, in combination:

a common, an input and an output terminal;

first and second bipolar transistors, each having a base and an emitter and a collector electrode, said two emitter electrodes being connected to said common terminal, the collector electrode of the first transistor being coupled to said input terminal, and the collector electrode of said second transistor being coupled to said output terminal;

a point of interconnection to which the base electrodes of said first and said second bipolar transistors are connected; and a degenerative feedback connection between the collector and base electrodes of said first bipolar transistor including:

a current path for base current flows connected between both base electrodes and a point of reference potential; and means connected to said input terminal and coupled to said path for controlling the flow of current through said path in response to a difference in potential between said input terminal and said point of interconnection, said means being isolated from said base electrodes and said current path with respect to direct current flow, wherein no base currents flow between said input terminal and said point of interconnection.

37. A current mirror amplifier as claimed in claim 36 wherein said degenerative feedback connection is by means of a field-effect transistor with its source electrode being connected to said point of interconnection, with its drain electrode being connected to said point of reference potential, with its channel between its said source and drain electrodes providing said current path for base current flows, and with its gate electrode being connected to said input terminal and providing said means for controlling the flow of current through said path.

38. A current mirror amplifier comprising, in combination:

a common, an input and an output terminal;

first and second bipolar transistors, each having a base and an emitter and a collector electrode, said two emitter electrodes being connected to said common terminal, the collector electrode of the first transistor being coupled to said input terminal and the collector electrode of said second transistor being coupled to said output terminal; and semiconductor means having a direct-current conduction path and a control electrode insulated from said path with respect to direct-current flow, for controlling the flow of current through said conduction path in response to a difference in potential between one end of said path and said control electrode, said one end of said path being direct-current coupled to both base electrodes, the other end of said path being direct-current coupled to a point of reference potential, and said control electrode being direct-current coupled to said input terminal.

* * * * *